(12) United States Patent
Cai

(10) Patent No.: US 10,319,265 B2
(45) Date of Patent: Jun. 11, 2019

(54) FLEXIBLE DISPLAY PANEL, FABRICATION METHOD, DISPLAY APPARATUS, AND PORTABLE TERMINAL

(71) Applicants: Shanghai Tianma Micro-Electronics Co., Ltd., Shanghai (CN); Tianma Micro-Electronics Co., Ltd., Shenzhen (CN)

(72) Inventor: Yu Cai, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 55 days.

(21) Appl. No.: 15/636,911

(22) Filed: Jun. 29, 2017

(65) Prior Publication Data
US 2017/0301267 A1    Oct. 19, 2017

(30) Foreign Application Priority Data

Dec. 19, 2016   (CN) .......................... 2016 1 1178198

(51) Int. Cl.
| | |
|---|---|
| *G09F 9/30* | (2006.01) |
| *H01L 51/00* | (2006.01) |
| *H01L 51/56* | (2006.01) |
| *G06F 1/16* | (2006.01) |
| *G02F 1/1333* | (2006.01) |

(52) U.S. Cl.
CPC ............ *G09F 9/301* (2013.01); *G06F 1/1652* (2013.01); *H01L 51/0097* (2013.01); *H01L 51/56* (2013.01); *G02F 1/133305* (2013.01); *G09G 2380/02* (2013.01)

(58) Field of Classification Search
CPC ....... H01L 2227/323; H01L 2251/5338; H01L 27/3218
See application file for complete search history.

(56) References Cited

U.S. PATENT DOCUMENTS

| | | | |
|---|---|---|---|
| 9,305,980 B2 | 4/2016 | Kim | |
| 2014/0231763 A1* | 8/2014 | Kim | ..................... H01L 27/3218 257/40 |
| 2015/0325815 A1* | 11/2015 | Kang | .................. H01L 51/5293 257/88 |
| 2016/0174304 A1* | 6/2016 | Kim | ....................... H05B 33/04 313/511 |

FOREIGN PATENT DOCUMENTS

CN          105518766 A     4/2016

* cited by examiner

*Primary Examiner* — Chun-Nan Lin
(74) *Attorney, Agent, or Firm* — Anova Law Group, PLLC

(57) ABSTRACT

A flexible display panel, a display apparatus, a portable terminal, and a flexible display panel fabrication method are provided. The flexible display panel comprises a display panel having a first surface and a second surface and capable of being bent towards the second surface, and a support layer disposed on the second surface of the display panel and configured to support the second surface of the display panel when bending the display panel, such that a local minimum radius of curvature in a bending portion of the display panel is greater than or equal to a predetermined value. The local minimum radius of curvature is the smallest radius of curvature anywhere in the bending portion of the flexible display panel.

17 Claims, 16 Drawing Sheets

FLEXIBLE DISPLAY PANEL, FABRICATION METHOD, DISPLAY APPARATUS, AND PORTABLE TERMINAL

CROSS-REFERENCES TO RELATED APPLICATIONS

This application claims the priority of Chinese Patent Application No. CN201611178198.8, filed on Dec. 19, 2016, the entire contents of which are incorporated herein by reference.

FIELD OF THE DISCLOSURE

The present disclosure generally relates to the display technology and, more particularly, relates to a flexible display panel, a fabrication method for the flexible display panel, a display apparatus, and a portable terminal.

BACKGROUND

In recent years, flexible display panels which are bendable or rollable have been developed to satisfy various customer demands. However, the existing flexible display panel has limitations. Due to the constraints of the materials and stacked layer structures, to avoid the bending damages of the flexible display panel, the bending angles of the flexible display panel have to be controlled. That is, the bending angle of the flexible display panel may be rather limited. Thus, certain customer's demands (e.g., back-to-back folding of the flexible display panel) may not be satisfied.

The disclosed flexible display panel, fabrication method for the flexible display panel, display apparatus, and portable terminal are directed to solve one or more problems set forth above and other problems.

BRIEF SUMMARY OF THE DISCLOSURE

One aspect of the present disclosure provides a flexible display panel. The flexible display panel comprises a display panel having a first surface and a second surface and capable of being bent towards the second surface, and a support layer disposed on the second surface of the display panel and configured to support the second surface of the display panel when bending the display panel, such that a local minimum radius of curvature in a bending portion of the display panel is greater than or equal to a predetermined value. The local minimum radius of curvature is the smallest radius of curvature anywhere in the bending portion of the flexible display panel.

Another aspect of the present disclosure provides a display apparatus comprising the disclosed flexible display panel.

Another aspect of the present disclosure provides a portable terminal comprising the disclosed display apparatus.

Another aspect of the present disclosure provides a fabrication method for the flexible display panel. The fabrication method comprises forming a display panel having a first surface and a second side and capable of being bent towards the second surface, and forming a support layer on the second surface of the display panel and configured to support the second surface of the display panel when bending the display panel, such that a local minimum radius of curvature in a bending portion of the display panel is greater than or equal to a predetermined value. The local minimum radius of curvature is the smallest radius of curvature anywhere in the bending portion of the flexible display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. All other embodiments obtained by those skilled in the art without making creative work are within the scope of the present invention.

The present disclosure will now be described in detail with reference to the accompanying drawings. When illustrating the embodiments of the present disclosure, certain areas of the schematic views of the device structures may be disproportionally enlarged for the convenience of illustration. In addition, the three-dimensional sizes including the length, width, and depth should be included in the actual implementation of the present disclosure.

The present disclosure provides an improved flexible display panel. The flexible display panel may be bent to any appropriate angle and appropriate shape and, meanwhile, a local minimum radius of curvature in the bending portion of the flexible display panel may not exceed a threshold that the flexible display panel can withstand during the bending, thereby avoiding damages to the flexible display panel due to the bending. The radius of curvature is the radius of a circle that best fits a normal section of a surface. The local minimum curvature of radius refers to the radius of curvature anywhere in the bending portion of the flexible display panel.

Figure 1A:
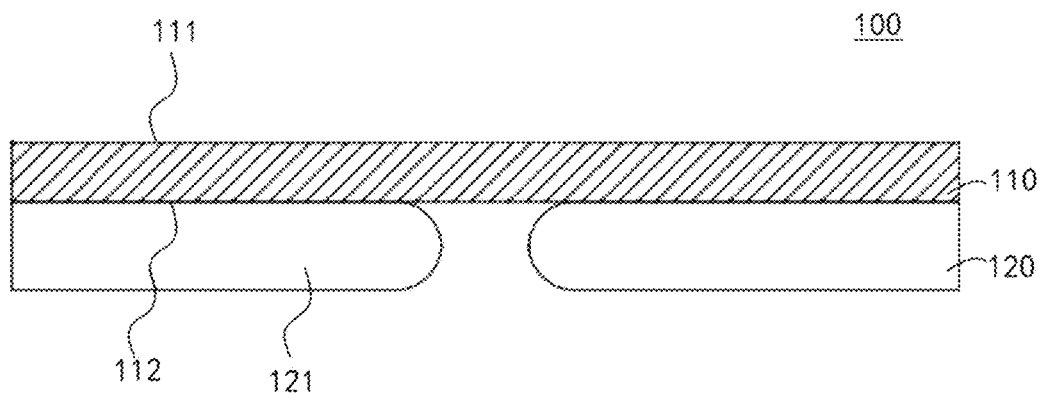
FIG. 1A illustrates a cross-sectional view of an exemplary flexible display panel according to the disclosed embodiments.
Figure 1B:
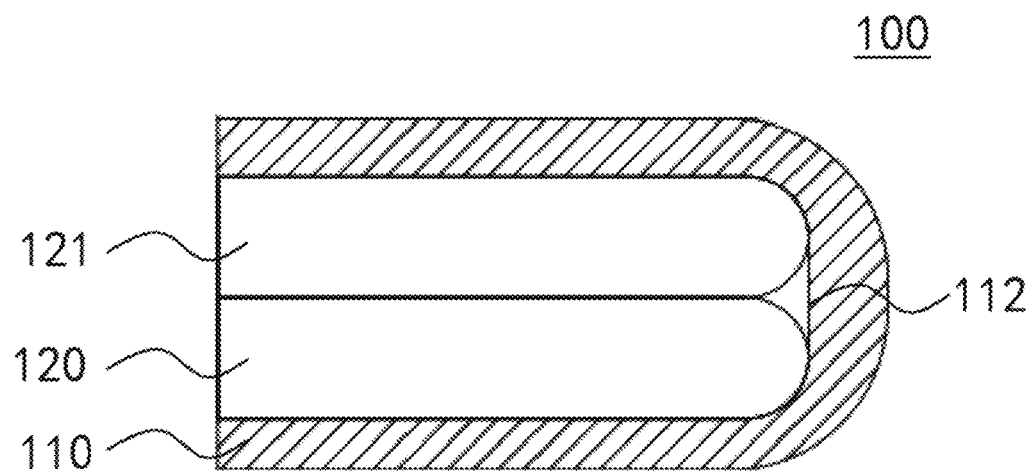
FIG. 1B illustrates a cross-sectional view of an exemplary flexible display panel in a bent position according to the disclosed embodiments.

FIG. 1A illustrates a cross-sectional view of an exemplary flexible display panel according to the disclosed embodiments. FIG. 1B illustrates a cross-sectional view of an exemplary flexible display panel in a bent position according to the disclosed embodiments. As shown in FIG. 1A and FIG. 1B, the flexible display panel 100 may include a display panel 110 having a first surface 111 and a second surface 112, and a support layer 120 disposed on the second surface 112 of the display panel 110. The display panel 110 may bend toward the second surface 112.

When bending the flexible display panel 100, the support layer 120 may support the second surface 112 of the display panel 110, such that the bending portion of the display panel 110 may have a local minimum radius of curvature greater than or equal to a predetermined value. Thus, the display panel 110 may be bent to any appropriate angle and appropriate shape and, meanwhile, the local minimum radius of curvature in the bending portion of the display panel 110 may not exceed a threshold that the display panel 110 can withstand during the bending, thereby avoiding damages to the flexible display panel 100 due to the bending.

In the disclosed embodiments, the local minimum radius of curvature in the bending portion of the display panel 110 may be configured to be greater than or equal to the predetermined value. That is, when bending the display panel 110, the radius of curvature anywhere in the bending portion may be greater than or equal to the predetermined value.

In one embodiment, the predetermined value may be the minimum radius of curvature that the display panel 110 can withstand. Because different display panels 110 are made of different materials and have different stacking structures, different display panels 110 may withstand different minimum radiuses of curvature. Those skilled in the art can determine the predetermined value by experiment. Thus, the predetermined value may be easily and clearly determined when designing and manufacturing the flexible display panel according to the present disclosure.

In one embodiment, as shown in FIG. 1A and FIG. 1B, the support layer 120 may be formed of an elastic material. When bending the flexible display panel 100, the display panel 110 may be bent. The support layer 120 formed of the elastic material may be deformed as the display panel 110 is bent, thereby preventing the local radius of curvature of the display panel 110 from being substantially small.

In addition, the support layer 120 may include a plurality of supporters 121. A space between two adjacent supporters 121 may correspond to the bending portion of the display panel 110. Referring to FIG. 1A, a space may be formed between two adjacent supporters 121, and in the space formed between two adjacent supporters 121, the support layer 120 may not contact the display panel 110. Thus, when bending the display panel 110, a portion of the display panel 110, which is corresponding to the space formed between two adjacent supporters 121, may be bent first.

As the bending of the display panel 110 continues, the two adjacent supporters 121 may come into contact with each other or even overlap each other. For example, referring to FIG. 1B, when bending the flexible display panel 100 to the maximum extent (i.e., folded), the two adjacent supporters 121 may overlap each other and support the second surface 112 of the display panel 110, such that the local minimum radius of curvature of the display panel 110 may be greater than or equal to a predetermined value.

Figure 2A:
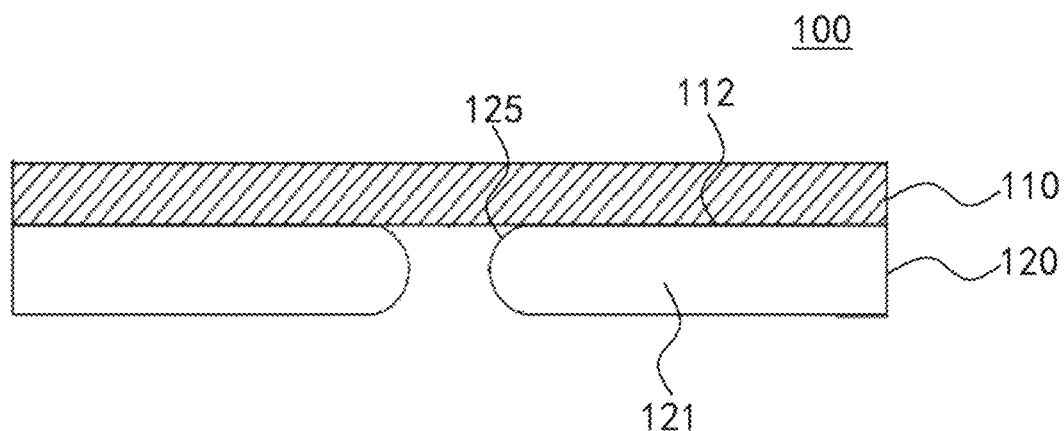
FIGS. 2A-2C illustrate partial cross-sectional views of an exemplary flexible display panel according to the disclosed embodiments.
Figure 2B:
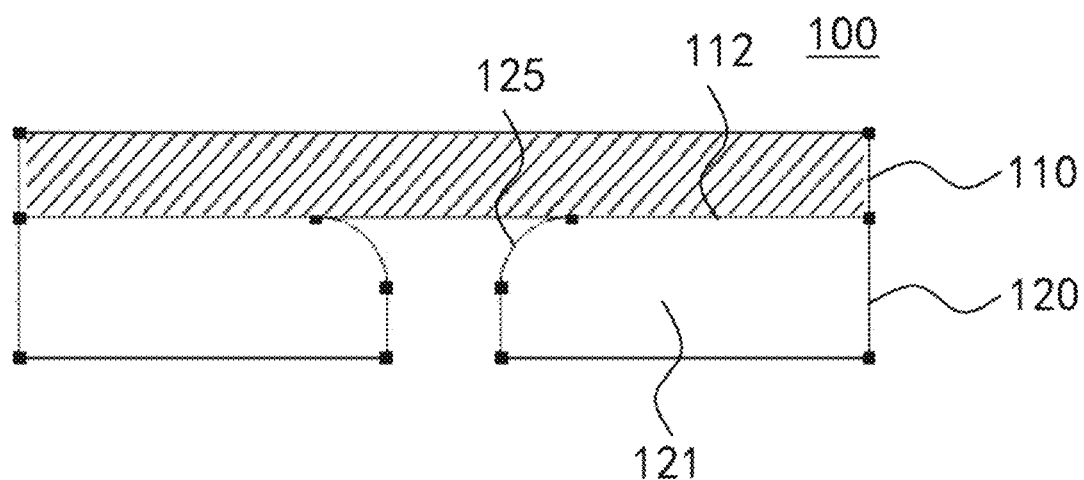
Figure 2C:
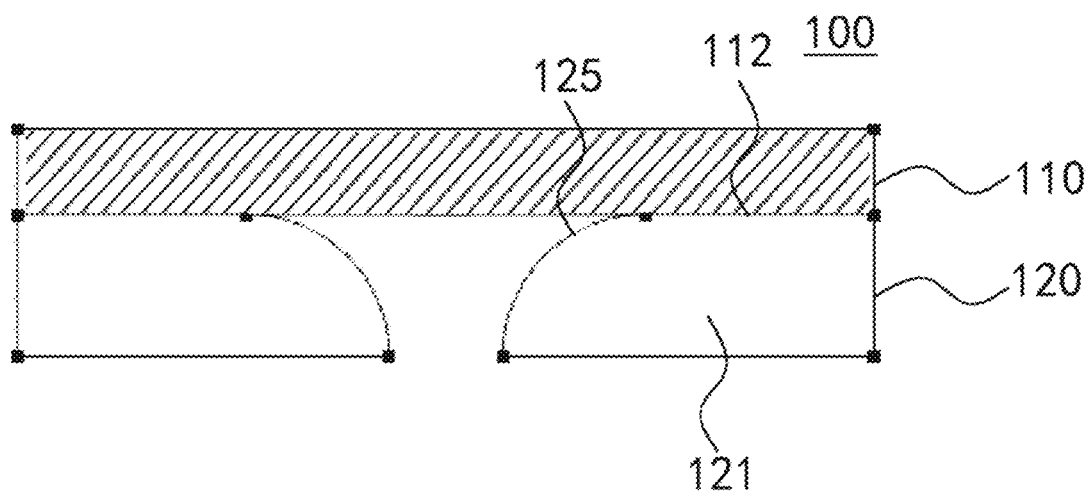

FIGS. 2A-2C illustrate partial cross-sectional views of an exemplary flexible display panel according to the disclosed embodiments. As shown in FIGS. 2A-2C, the supporter 121 of the flexible display panel 100 may have an end in an arcuate shape 125. An end point of the arcuate shape may be in contact with the second surface 112 of the display panel 110.

Referring to FIGS. 2A-2C, the end of the supporter 121 may have different shapes. In one embodiment, as shown in FIG. 2A, the supporter 121 may have the end in a semi-circular shape, where the arcuate shape 125 may form the entire end of the supporter 121. In another embodiment, as shown in FIG. 2B, the supporter 121 may have the end in a combination of the arcuate shape 125 and the linear portion. In another embodiment, as shown in FIG. 2C, the supporter 121 may have the end in a partial arcuate shape, for example, a quarter-circular shape.

The various shapes of the supporters shown in FIGS. 2A-2C are for illustrative purpose and not intended to limit the scope of the present disclosure. According to the practical applications, the supporter 121 may have the end in other curved shapes or combination of other curved shapes and linear shapes, such that the contact portion between the end of the supporter 121 and the second surface of the display panel 110 may include an arcuate shape 125.

In one embodiment, at the end point of the arcuate shape 125 contacting the second surface 112 of the display panel 110, the arcuate shape 125 may be tangent to the second surface 112 of the display panel 110. In other words, at the end point of the arcuate shape 125 contacting the second surface 112 of the display panel 110, an angle formed between a tangent line of the arcuate shape 125 and the second surface 112 of the display panel 110 may be about 0°. In another embodiment, at the end point of the arcuate shape 125 contacting the second surface 112 of the display panel 110, the angle formed between a tangent line of the arcuate shape 125 and the second surface 112 of the display panel 110 may be greater than or equal to about 0° and smaller than 90°.

Figure 3A:
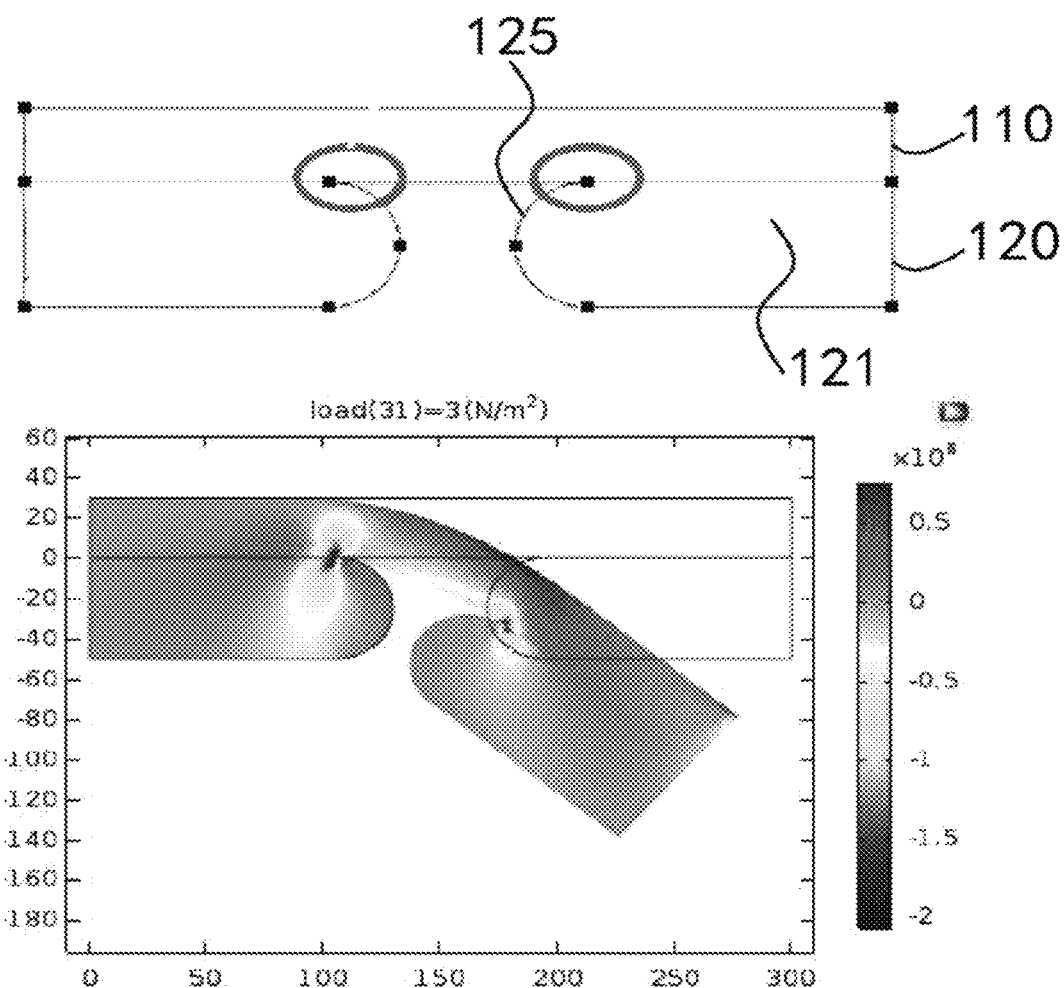
FIGS. 3A-3C illustrate various shapes of an exemplary support layer of an exemplary flexible display panel according to the disclosed embodiments and corresponding stress profiles.
Figure 3B:
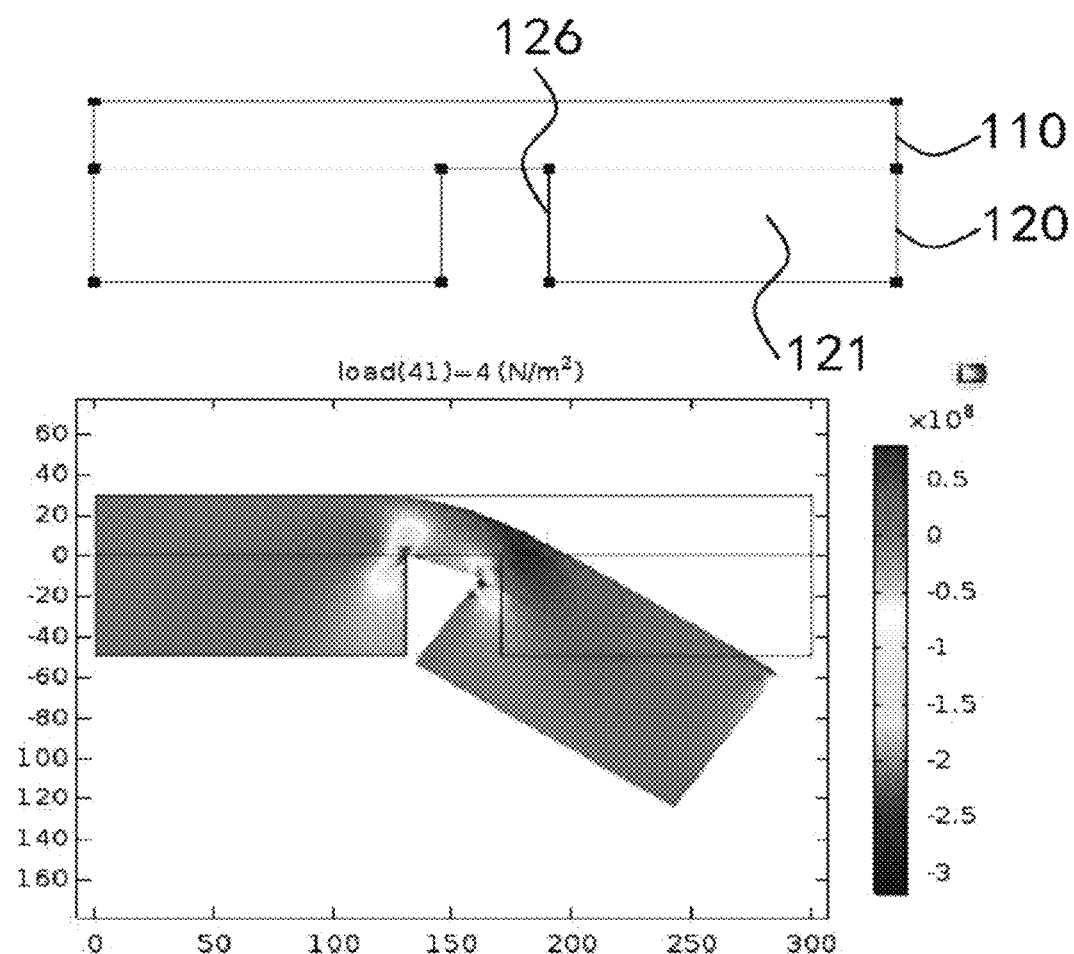
Figure 3C:
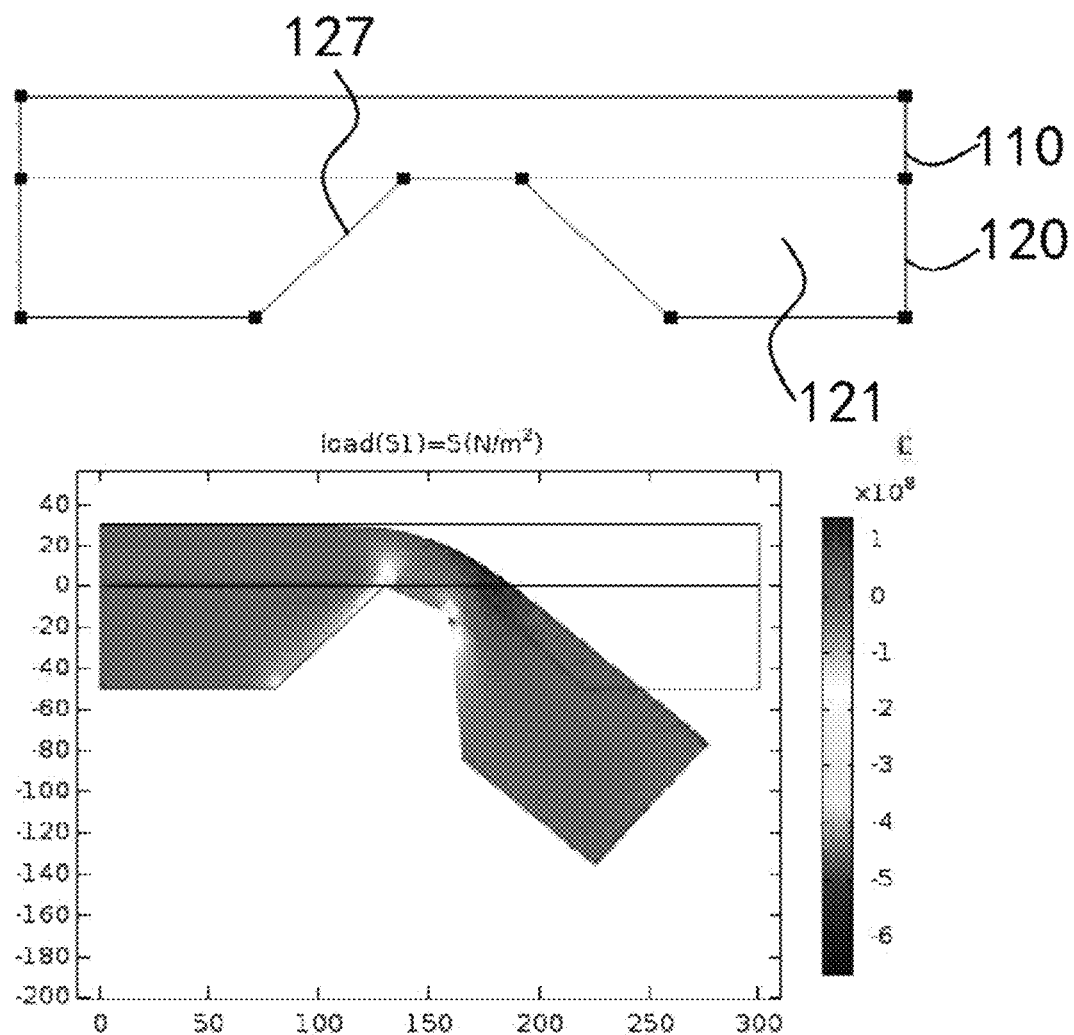

FIGS. 3A-3C illustrate various shapes of an exemplary support layer of an exemplary flexible display panel according to the disclosed embodiments and corresponding stress distribution profiles. Referring to FIGS. 3A-3C, the supporter 121 in the support layer 120 of the flexible display panel 100 may have the end in the arcuate shape 125, in a linear shape 126 perpendicular to the second surface of the 112, and in a slope shape 127 forming an obtuse angle with respect to the second surface 112, respectively. Through measuring the stress in the bending process of the flexible display panel 100 having different end shapes of the supporters 121, the stress distribution profiles of the flexible display panels in FIGS. 3A-3C may be obtained.

According to the stress profiles, when the end of the supporter 121 has a straight line 126 perpendicular to the second surface 112 (shown in FIG. 3B), or an oblique line 127 forming the obtuse angle with respect to the second surface 112 (shown in FIG. 3C), the display panel 110 may be subject to a larger stress. For example, as shown in FIG. 3B and FIG. 3C, a large positive stress (i.e., tensile stress) may be widely distributed in the display panel 110. Further, a large negative stress (i.e., compressive stress) may be distributed at a bottom end position (i.e., a position where the supporter 121 and the second surface 112 intersect).

In addition, as shown in FIG. 3B and FIG. 3C, a local bending with a substantially small radius of curvature may exist at the position where the supporter 121 and the second surface 112 intersect. Because the local bending has the substantially small radius of curvature, and the stress concentrates in a local area of the display panel 110, the display panel 110 may be easily damaged. On the other hand, as shown in FIG. 3A, when the end of the supporter 121 has the arcuate shape 125, the local bending with the substantially small radius of curvature may not exist, and the display panel 110 may be subject to a smaller stress.

For example, as shown in FIG. 3A, the positive stress distributed in the display panel 110 may be obviously smaller than the positive stresses in FIG. 3B and FIG. 3C. Further, the supporter 121 may contact the second surface 112 at a bottom end position. A large section near the bottom end position may have a smaller stress. For example, as shown in FIG. 3A, the section near the bottom end position may have the smaller stress and may be highlighted in a lighter shade. Thus, the stress may not concentrate at the bottom end position. Because the radius of curvature in the local area is configured to be greater than or equal to the predetermined value, and the stress does not concentrate in the small local area, the display panel 110 may be prevented from bending damages.

Figure 12A:
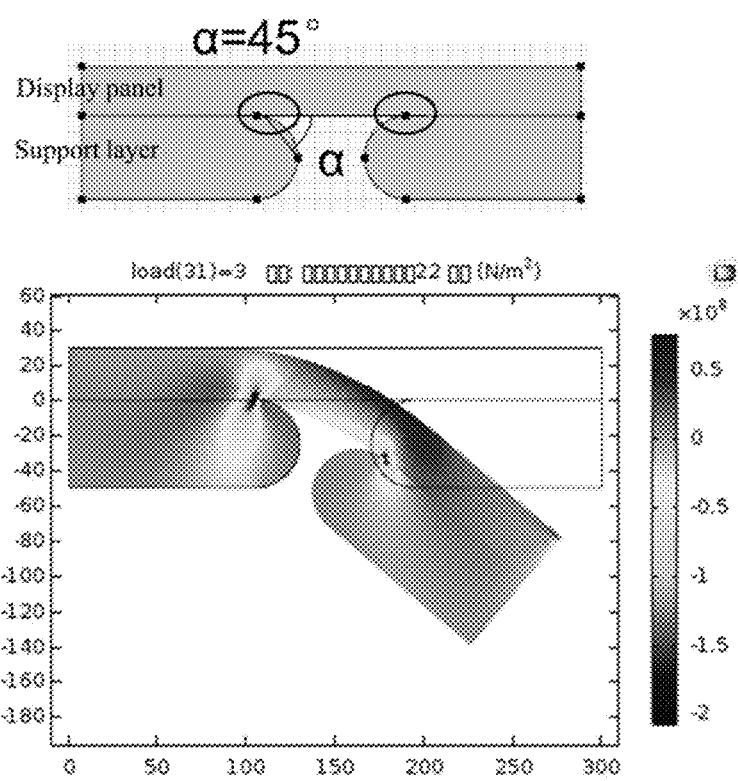
FIGS. 12A-12B illustrate various shapes of an exemplary support layer of an exemplary flexible display panel according to the disclosed embodiments and corresponding stress profiles.
Figure 12B:
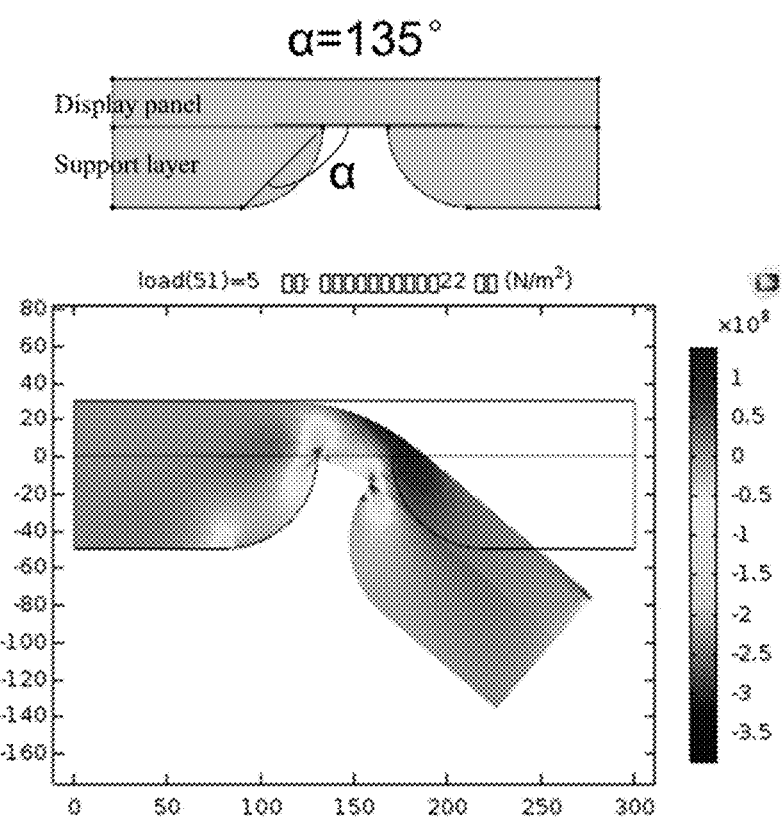

FIGS. 12A-12B illustrate various shapes of an exemplary support layer of an exemplary flexible display panel according to the disclosed embodiments and corresponding stress distribution profiles. Referring to FIGS. 12A-12B, the supporter 121 in the support layer 120 of the flexible display panel 100 may have the end in the arcuate shape 125. Through measuring the stress in the bending process of the flexible display panel 100 having different end shapes of the supporters 121, the stress distribution profiles of the flexible display panels in FIGS. 12A-12B may be obtained.

For example, as shown in FIG. 12A, the positive stress distributed in the display panel 110 may be obviously smaller than the positive stresses in FIG. 12B. Further, the supporter 121 may contact the second surface 112 at a bottom end position. A large section near the bottom end position may have a smaller stress. For example, as shown in FIG. 12A, the section near the bottom end position may have the smaller stress and may be highlighted in a lighter shade. Thus, the stress may not concentrate at the bottom end position. Because the radius of curvature in the local area is configured to be greater than or equal to the predetermined value, and the stress does not concentrate in the small local area, the display panel 110 may be prevented from bending damages.

As show in FIG. 3B, the end of the supporter 121 may have the straight line 126 perpendicular to the second surface 112 of the display panel 110. As shown in FIG. 3C, the end of the supporter 121 may have the oblique line 127 forming the obtuse angle with respect to the second surface 112 of the display panel 110. FIG. 3B and FIG. 3C illustrates exemplary end of the supporter 121 which may result concentrated stress in the small local area.

It should be understood that, when the supporter 121 has the end in the arcuate shape 125, and at the position where the arcuate shape 125 and the second surface 112 of the display panel 110 intersect, the tangent line of the arcuate shape 125 is perpendicular to the second surface 112 or forms an obtuse angle with the second surface 112 (i.e., the angle between the tangent line and the second surface is greater than or equal to about 90°), the display panel 110 may have stress profiles similar to FIG. 3B and FIG. 3C, i.e., the stress concentrates in the small local area.

Figure 4A:
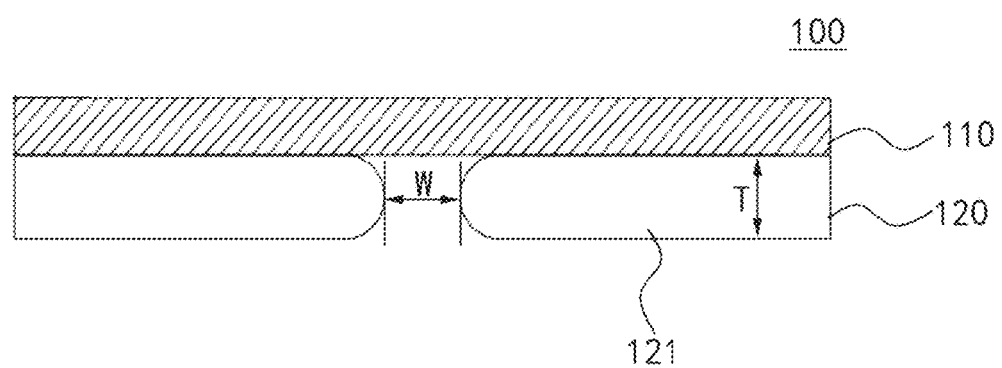
FIG. 4A illustrates a cross-sectional view of another exemplary flexible display panel according to the disclosed embodiments.
Figure 4B:
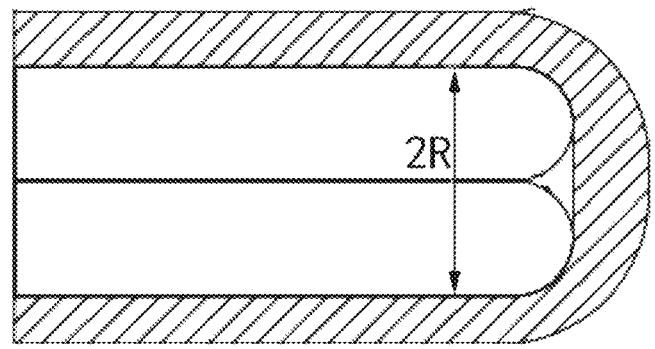
FIG. 4B illustrates a cross-sectional view of another exemplary flexible display panel in a bent position according to the disclosed embodiments.

FIG. 4A illustrates a cross-sectional view of another exemplary flexible display panel according to the disclosed embodiments. FIG. 4B illustrates a cross-sectional view of another exemplary flexible display panel in a bent position according to the disclosed embodiments. As shown in FIG. 4A and FIG. 4B, W denotes a distance between two adjacent supporters 121 of the flexible display panel 100, T denotes a thickness of the support layer 120, and R denotes a maximum radius of the completely bent display panel 110, i.e., the maximum bending radius of the display panel 110.

In one embodiment, the conditions T≥2R, and W>2R may be satisfied. When the conditions T≥2R, and W>2R are satisfied, the bending angle of the display panel 110 may not be limited by the interference between the supporters 121 when bending the flexible display panel 100. That is, when the conditions T≥2R, and W>2R are satisfied the bending angle of the display panel 110 may be prevented from being affected by the interference between the supporters 121. In addition, the local minimum radius of curvature of the bending portion of the display panel 110 is greater than or equal to the predetermined value.

In the disclosed embodiment, the support layer 120 may not limit the bending angle of the display panel 110. Thus, the display panel 110 may be bent to any appropriate angle. For example, the display panel 110 may be bent in various ways, and two bending portions of the display panel 110 may form an obtuse angle, a right angle, an acute angle, or even zero angle (i.e., the display panel 110 is completely folded).

In another embodiment, the support layer 120 may be configured to have an elastic modulus smaller than the substrate (e.g., the substrate located on the second surface 112) of the display panel 110.

Figure 5A:
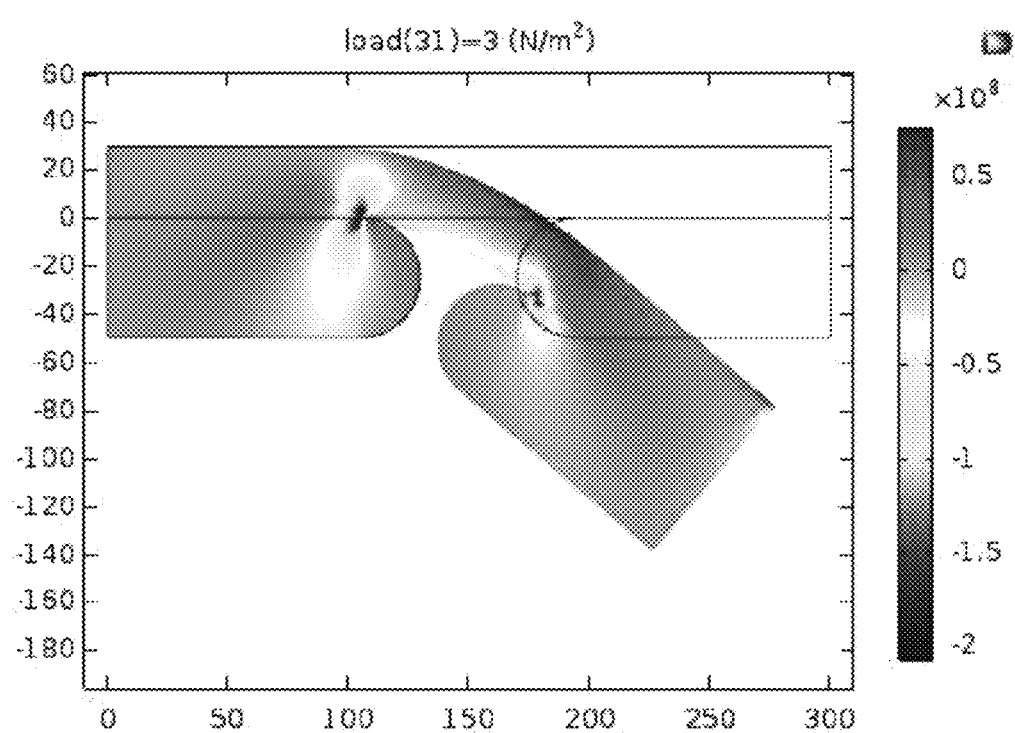
FIG. 5A illustrates a stress distribution profile when a support layer elastic modulus is greater than a substrate elastic modulus in an exemplary flexible display panel according to the disclosed embodiments.
Figure 5B:
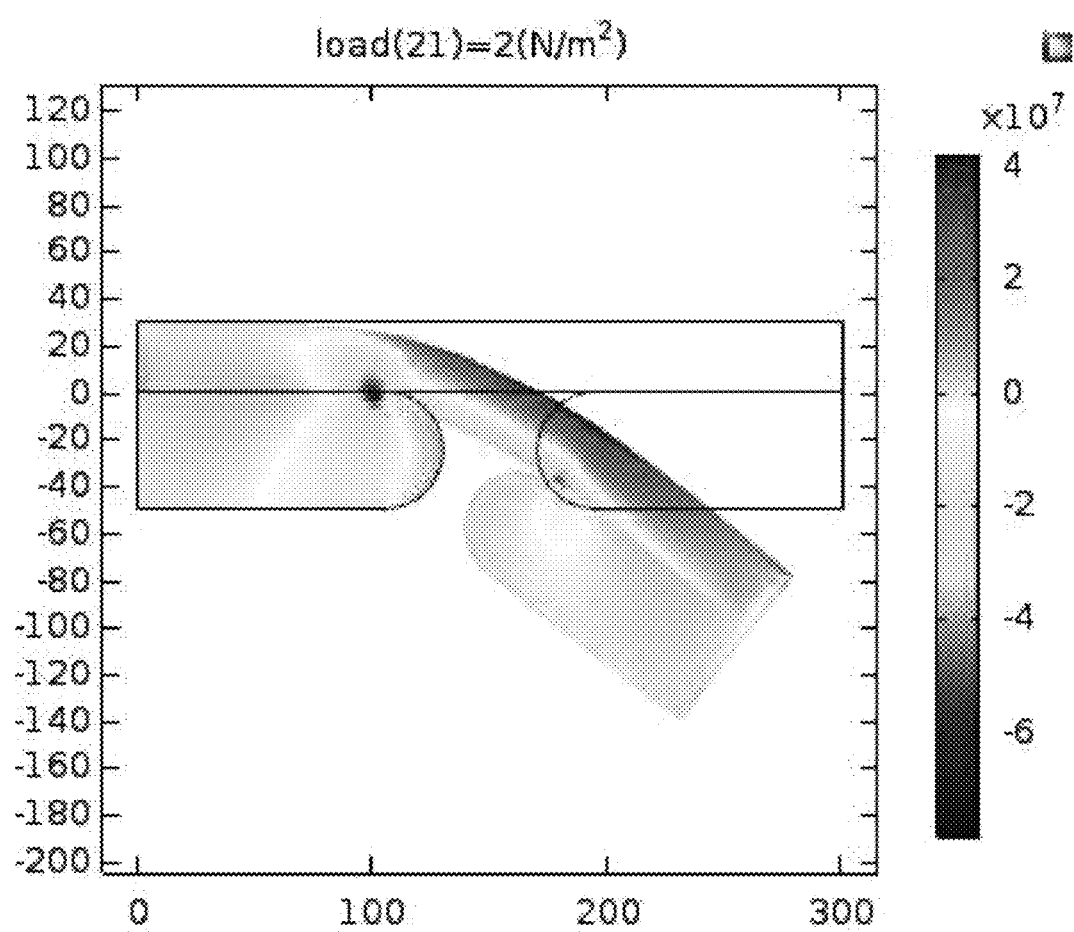
FIG. 5B illustrates a stress distribution profile when a support layer elastic modulus is smaller than a substrate elastic modulus in an exemplary flexible display panel according to the disclosed embodiments.

FIG. 5A illustrates a stress profile in the case where a support layer elastic modulus is greater than a substrate elastic modulus in an exemplary flexible display panel according to the disclosed embodiments. FIG. 5B illustrates a stress profile in the case where a support layer elastic modulus is smaller than a substrate elastic modulus in an exemplary flexible display panel according to the disclosed embodiments.

As shown in FIG. 5A and FIG. 5B, when the support layer 120 has the elastic modulus greater than the substrate of the display panel 110, the display panel 110 may be subject to a larger stress, and the stress may be more likely to concentrate in the display panel 110, such that the stress in the display panel 110 may concentrate at the end point where the arcuate shape 125 of the end of the supporter 121 contacts the second surface 112. When the support layer 120 has the elastic modulus smaller than the substrate of the display panel 110, the display panel 110 may be subject to a smaller stress, and the stress in the display panel 110 may spread out in the vicinity of the end point where the arcuate shape 125 of the end of the supporter 121 contacts the second surface 112, such that the stress in the display panel 110 may not concentrate in any local area. Thus, when the support layer 120 is configured to have the elastic modulus smaller than the substrate of the display panel 110, bending damages to the display panel 110 may be effectively prevented.

Figure 6:
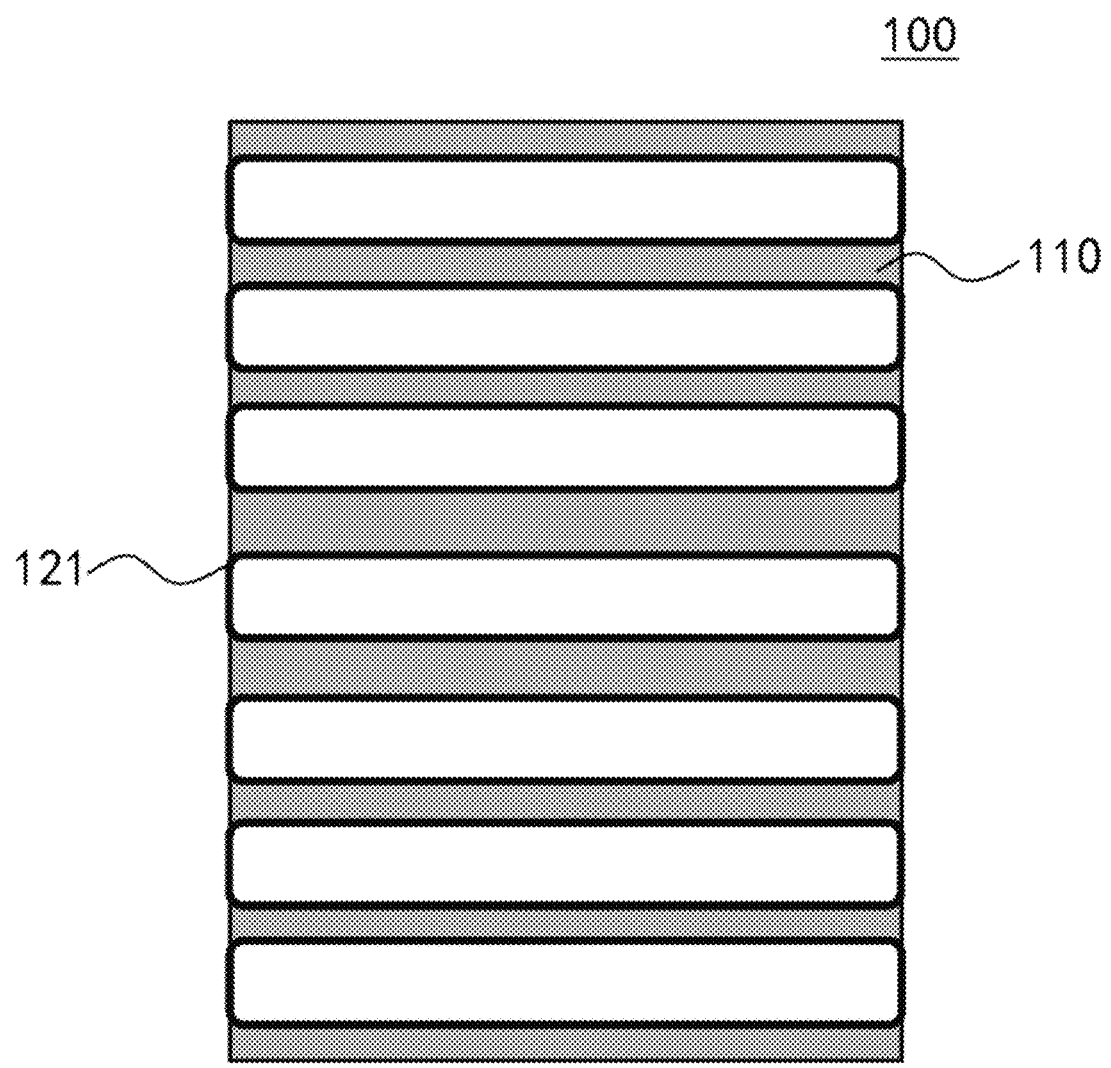
FIG. 6 illustrates an exemplary supporter distribution diagram of an exemplary flexible display panel according to the disclosed embodiments.
Figure 7:
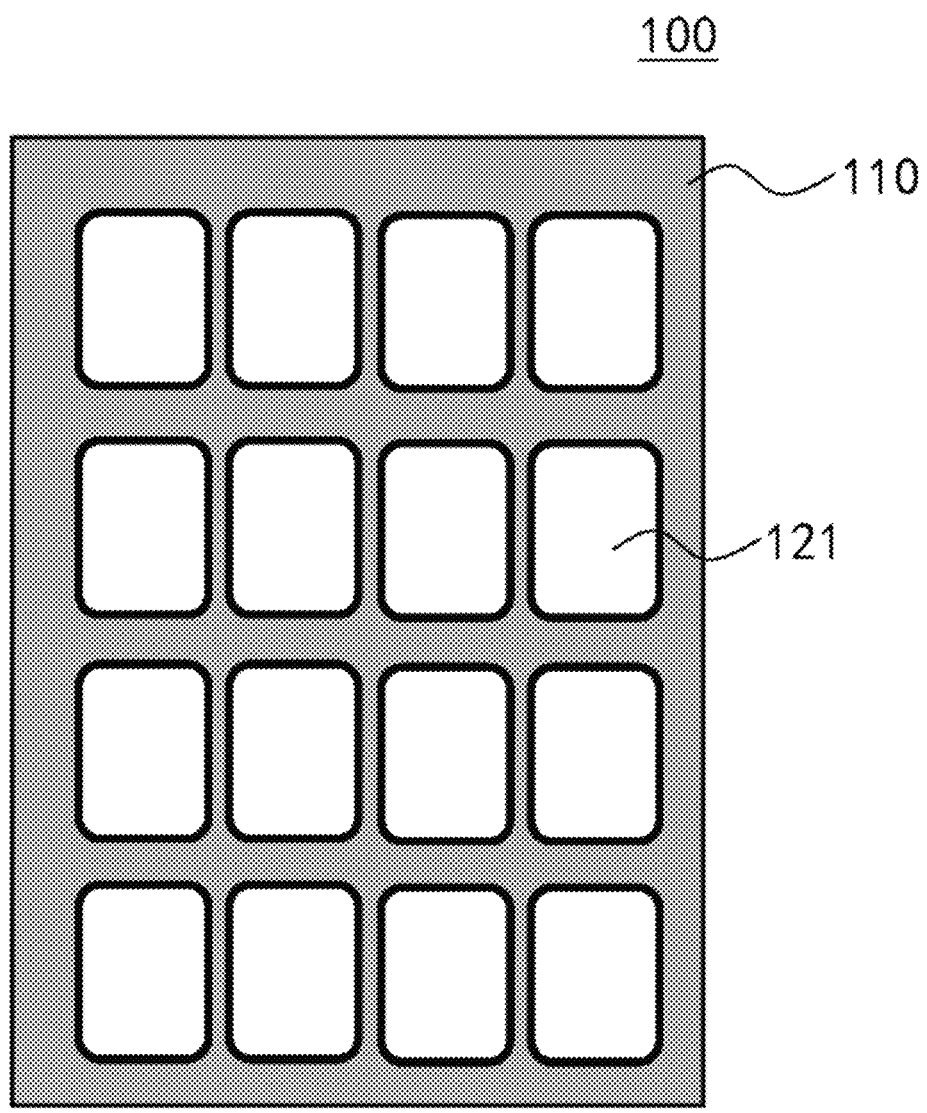
FIG. 7 illustrates another exemplary supporter distribution diagram of an exemplary flexible display panel according to the disclosed embodiments.

The arrangement of the supporters on the display panel may be varied according to various application scenarios. FIG. 6 illustrates an exemplary supporter distribution diagram of an exemplary flexible display panel according to the disclosed embodiments. FIG. 7 illustrates another exemplary supporter distribution diagram of an exemplary flexible display panel according to the disclosed embodiments.

As shown in FIG. 6, when viewing from a direction perpendicular to the display panel 110, a plurality of supporters 121 each having a striped-shape may be arranged in parallel to each other. As shown in FIG. 7, when viewing from the direction perpendicular to the display panel 110, a plurality of supporters 121 each having a rectangular shape may be arranged in an array. The two arrangements in FIG. 6 and FIG. 7 are for illustrative purposes only, and not intended to limit the scope of the present disclosure. The supporters 121 may be arranged in other ways according to the practical applications.

In addition, in certain embodiments, the flexible display panel 100 may further comprise a protective layer (not shown). The support layer 120 may have a first side facing the display panel 110 and an opposing side. The protective layer may be disposed on the opposing side of the support layer 120. The protective layer 120 may be flexible and cover the support layer 120, thereby preventing external debris from entering the gaps between the supporters 121.

Figure 8:
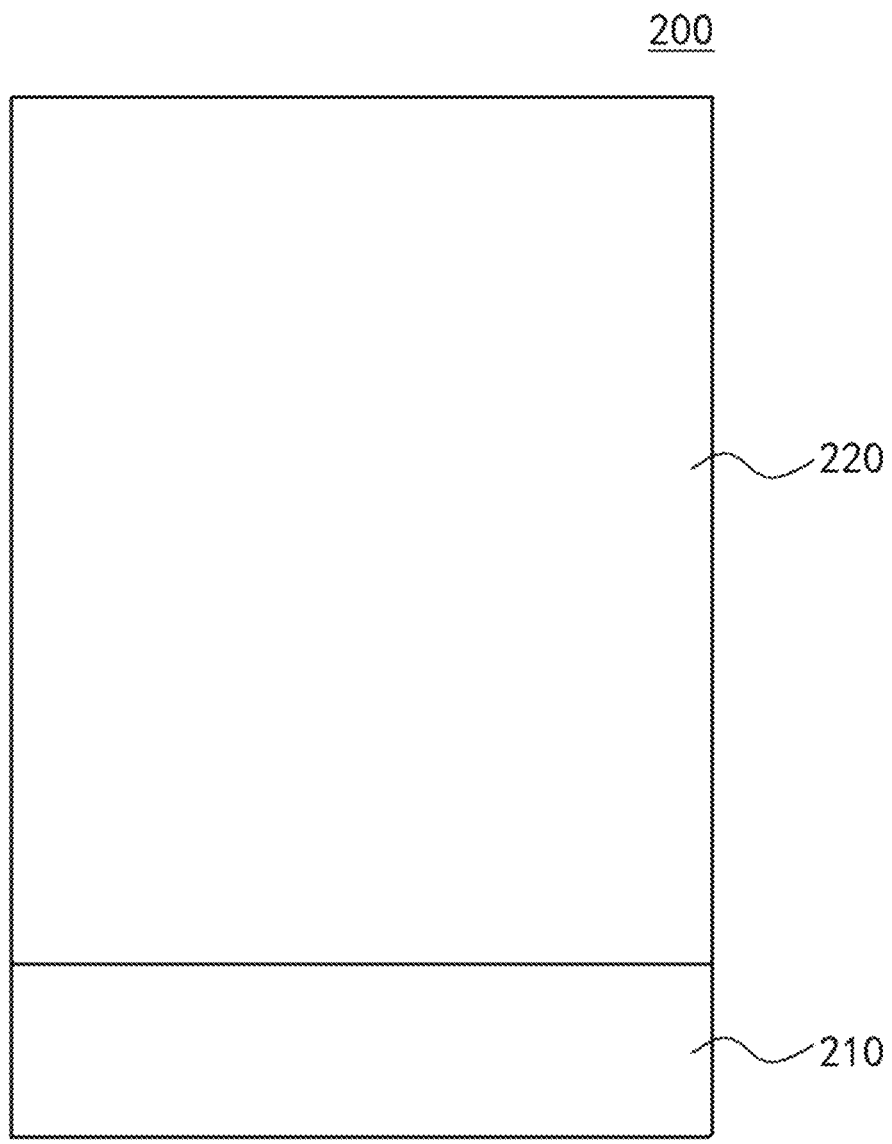
FIG. 8 illustrates a schematic view of an exemplary display apparatus according to the disclosed embodiments.

Further, in one embodiment, the display panel 110 may have the first surface 111 for displaying images and the second surface 112 not for displaying images. That is, the support layer 120 may be formed on the surface of the display panel 110, which is not intended to display images, i.e., the second surface 112. In another embodiment, the display panel 110 may have the first surface 111 either for displaying images or not for displaying image, and the second surface 112 for displaying images. Then the support layer 120 may be formed on the surface of the display panel 110, intended to display images. The support layer 120 may be formed of a transparent material, such that the support layer 120 may not block the displayed images FIG. 8 illustrates a schematic view of an exemplary display apparatus according to the disclosed embodiments. As shown in FIG. 8, the display apparatus 200 may comprise a driving circuit 210 providing driving signals for the image displaying, and a flexible display panel 220. The flexible display panel 220 may be any one of the flexible display panels 100 disclosed by the present disclosure. Thus, the description of the flexible display panel 220 may be referred to the flexible display panels 100 according to the disclosed embodiments, and may not be repeated herein.

Figure 9:
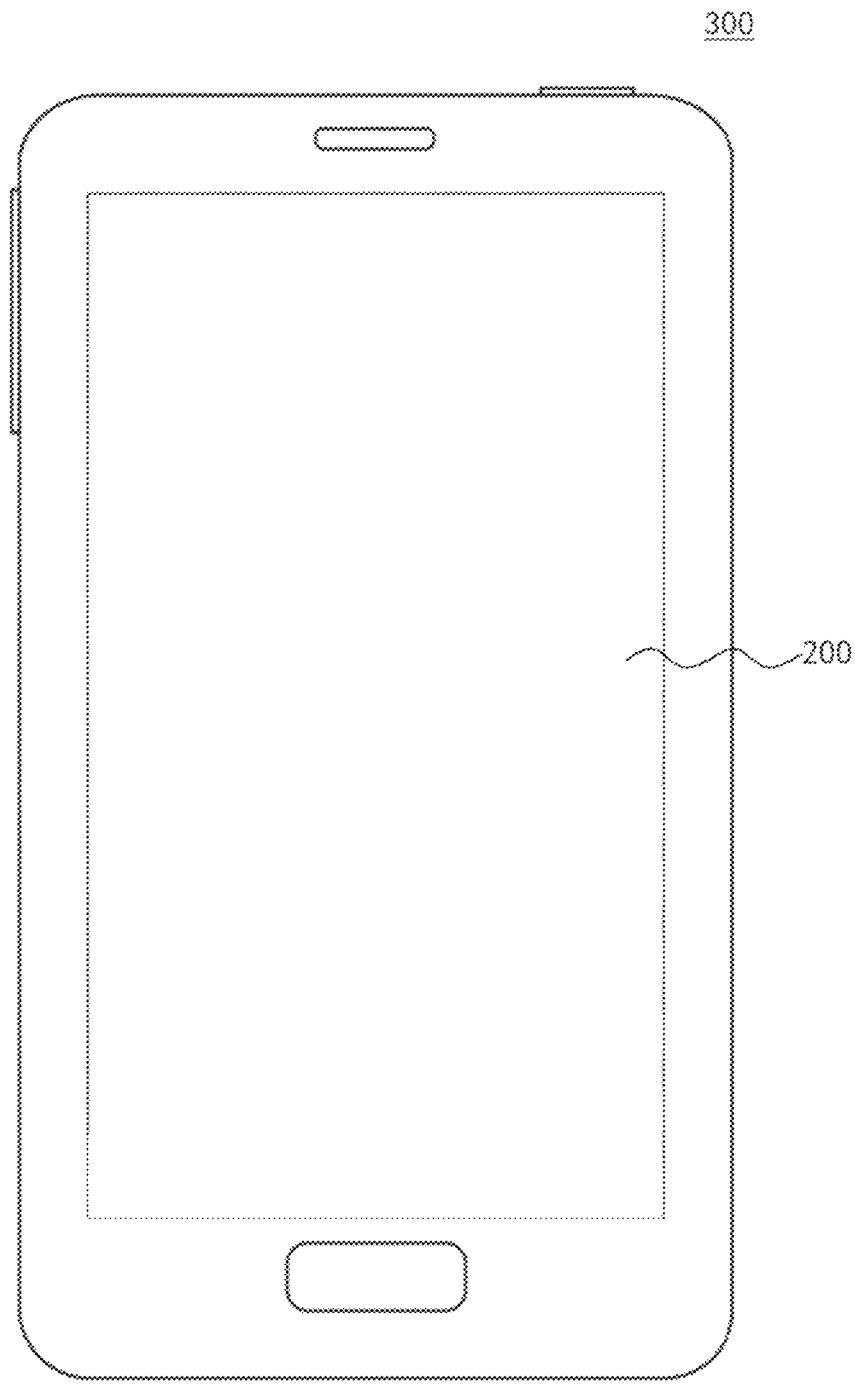
FIG. 9 illustrates a schematic view of an exemplary portable terminal according to the disclosed embodiments.

FIG. 9 illustrates a schematic view of an exemplary portable terminal according to the disclosed embodiments. As shown in FIG. 9, the portable terminal 300 may comprise a display apparatus 200 disclosed by the present disclosure.

Thus, the description of the display apparatus 200 may be referred to the disclosed embodiments for the display apparatus 200, and may not be repeated herein. The portable terminal may be a smart phone, a smart watch, a VR goggle, a smart hand band, an electronic paper, a television set, an automotive display, or any appropriate electronic equipment with a display panel, which is not limited by the present disclosure.

Figure 10:
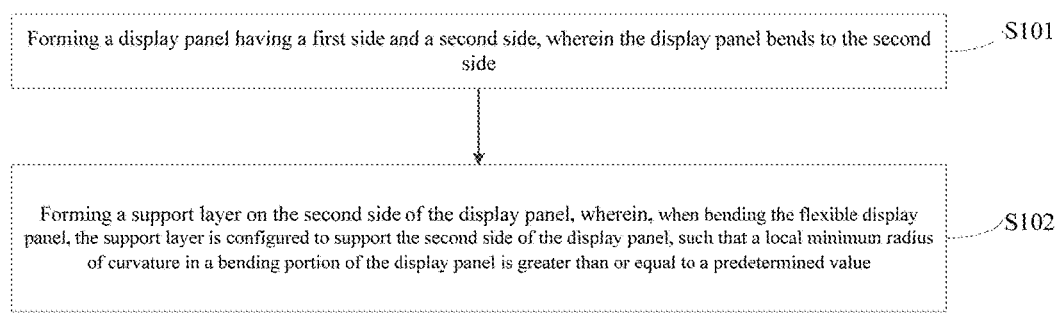
FIG. 10 illustrates a flow chart of an exemplary flexible display panel fabrication method according to the disclosed embodiments.

FIG. 10 illustrates a flow chart of an exemplary flexible display panel fabrication method according to the disclosed embodiments. As shown in FIG. 10, at the beginning, a display panel having a first surface and a second surface and capable of being bend towards the second surface is formed (S101). The corresponding structure is shown in FIG. 1A. As shown in FIG. 1A, the display panel 110 may have a first surface 111 and a second surface 112. The flexible display panel 100 may be bent to the second surface 112.

Returning to FIG. 10, after the display panel is formed, a support layer is formed on the second surface of the display panel (S102). The corresponding structure is shown in FIG. 1A. As shown in FIG. 1A, a support layer 120 may be formed on the second surface 112 of the display panel 110. When bending the flexible display panel, the support layer 120 may be configured to support the second surface 112 of the display panel 110, such that the local minimum radius of curvature in the bending portion of the display panel 110 may be greater than or equal to a predetermined value.

Figure 11:
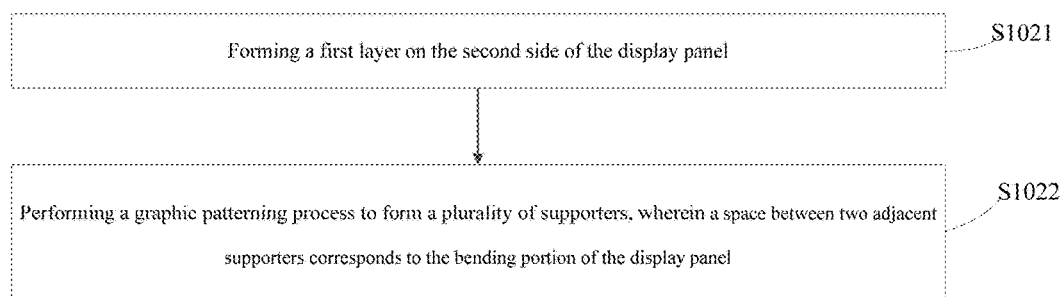
FIG. 11 illustrates a flow chart of an exemplary flexible display panel fabrication method according to the disclosed embodiments.

FIG. 11 illustrates a flow chart of an exemplary fabrication method for an exemplary flexible display panel according to the disclosed embodiments. In one embodiment, the step S102 in FIG. 10 may comprise a plurality of sub-steps. As shown in FIG. 11, after the display panel is formed, a first layer is formed on the second surface of the display panel (S1021). After the first layer is formed on the second surface of the display panel, a graphic patterning process is performed on the first layer to form a plurality of supporters (S1022). The corresponding structure is shown in FIG. 1A. As shown in FIG. 1A, after a graphic patterning process is formed on the support layer 120, a plurality of supporters 121 may be formed. A space between two adjacent supporters 121 may correspond to the bending portion of the display panel 110.

More description of the fabrication method for the flexible display panel may be referred to the disclosed embodiments of the flexible display panel, and may not be repeated herein.

The present disclosure provides a flexible display panel, a display apparatus, a portable terminal, and a flexible display panel fabrication method. The flexible display panel may comprise a display panel having a first surface and a second surface and capable of being bent towards the second surface, and a support layer disposed on the second surface of the display panel and configured to support the second surface of the display panel when bending the display panel, such that a local minimum radius of curvature in a bending portion of the display panel is greater than or equal to a predetermined value.

The flexible display panel may be bent to any appropriate angle and appropriate shape and, meanwhile, a local minimum radius of curvature in the bending portion of the flexible display panel may not exceed a threshold that the flexible display panel can withstand during the bending, thereby avoiding the bending damages of the flexible display panel. The radius of curvature is the radius of a circle that best fits a normal section of a surface. The local minimum curvature of radius refers to the smallest radius of curvature anywhere in the bending portion of the flexible display panel.

It should be noted that the various embodiments in the present specification are described in a progressive manner. Each embodiment is mainly described in terms of differences from the previously described embodiments. The similarities between different embodiments are not repeated, and may be incorporated by references.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A flexible display panel, comprising:
   a display panel having a first surface and a second surface and capable of being bent towards the second surface; and
   at least two supporters disposed on the second surface of the display panel and configured to support the second surface of the display panel when bending the display panel, such that a local minimum radius of curvature in a bending portion of the display panel is greater than or equal to a predetermined value, wherein:
   the local minimum radius of curvature is the smallest radius of curvature anywhere in the bending portion of the flexible display panel,
   a space between two adjacent supporters of the at least two supporters corresponds to the bending portion of the display panel, and $W > 2R$, and $T \geq 2R$, where W denotes a distance between the two adjacent supporters of the at least two supporters of the flexible display panel, T denotes a thickness of each of the two adjacent supporters of the at least two supporters, and R denotes a maximum bending radius of the display panel.

2. The flexible display panel according to claim 1, wherein: the at least two supporters are made of elastic material.

3. The flexible display panel according to claim 1, wherein:
   each of the two adjacent supporters of the at least two supporters has an end in an arcuate shape;
   one end point of the arcuate shape contacts with the second surface of the display panel; and
   at a position where the arcuate shape and the second surface of the display panel intersect with each other, an angle formed between a tangent line of the arcuate shape and the second surface of the display panel is greater than or equal to 0° and smaller than 90°.

4. The flexible display panel according to claim 3, wherein:
   the angle formed between the tangent line of the arcuate shape and the second surface of the display panel is 0°.

5. The flexible display panel according to claim 1, wherein:
   in a direction perpendicular to the display panel, a supporter of the at least two supporters has a striped shape, and the at least two supporters are arranged in parallel.

6. The flexible display panel according to claim 1, wherein:
   in a direction perpendicular to the display panel, a supporter of the at least two supporters has a rectangular shape, and the at least two supporters are arranged in an array.

7. The flexible display panel according to claim 1, further comprising a protective layer, wherein:
   the at least two supporters have a first surface facing the display panel and an opposing side;
   the protective layer is disposed on the opposing side of the at least two supporters;
   the protective layer is flexible; and
   the protective layer covers the at least two supporters.

8. The flexible display panel according to claim 1, wherein:
   the first surface of the display panel is configured to display images; and
   the second surface of the display panel is not configured to display images.

9. The flexible display panel according to claim 1, wherein:
   the first surface of the display panel is configured to either display images or not display images, and the second surface of the display panel is configured to display images; and
   the at least two supporters are formed of a transparent material.

10. The flexible display panel according to claim 1, wherein:
    the at least two supporters have an elastic modulus smaller than a substrate located on the second surface of the display panel.

11. A display apparatus, comprising the flexible display panel according to claim 1.

12. A portable terminal, comprising the display apparatus according to claim 11.

13. The flexible display panel according to claim 1, wherein:
    each of the two adjacent supporters of the at least two supporters has an end in arcuate shape, and arcuate-shaped ends of the two adjacent supporters face each other.

14. A fabrication method for a flexible display panel, comprising:
    forming a display panel having a first surface and a second surface, and capable of being bent towards the second surface; and
    forming at least two supporters on the second surface of the display panel and configured to support the second surface of the display panel when bending the display panel, such that a local minimum radius of curvature in a bending portion of the display panel is greater than or equal to a predetermined value, wherein:
    the local minimum radius of curvature is the smallest radius of curvature anywhere in the bending portion of the flexible display panel,
    a space between two adjacent supporters of the at least two supporters corresponds to the bending portion of the display panel, and
    $W > 2R$, and $T \geq 2R$, where W denotes a distance between the two adjacent supporters of the at least two supporters of the flexible display panel, T denotes a thickness of each of the two adjacent supporters of the at least two supporters, and R denotes a maximum bending radius of the display panel.

15. The fabrication method according to claim 14, wherein forming the at least two supporters on the second surface of the display panel further comprises:
- forming a first layer on the second surface of the display panel; and
- performing a graphic patterning process to form the at least two supporters.

16. The fabrication method according to claim 15, wherein:
- each of the two adjacent supporters of the at least two supporters has an end in an arcuate shape;
- one end point of the arcuate shape contacts with the second surface of the display panel; and
- at a position where the arcuate shape and the second surface of the display panel intersect with each other, an angle formed between a tangent line of the arcuate shape and the second surface of the display panel is greater than or equal to 0° and smaller than 90°.

17. The fabrication method according to claim 16, wherein:
- the angle formed between the tangent line of the arcuate shape and the second surface of the display panel is 0°.

\* \* \* \* \*